(12) United States Patent
Choi et al.

(10) Patent No.: US 11,283,047 B2
(45) Date of Patent: Mar. 22, 2022

(54) WASHABLE NANO-STRATIFIED ENCAPSULATION BARRIER AND ELECTRONIC DEVICE INCLUDING THE SAME

(71) Applicant: KOREA ADVANCED INSTITUTE OF SCIENCE AND TECHNOLOGY, Daejeon (KR)

(72) Inventors: Kyung Cheol Choi, Daejeon (KR); Eun Gyo Jeong, Daejeon (KR); Yong Min Jeon, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 61 days.

(21) Appl. No.: 16/907,459

(22) Filed: Jun. 22, 2020

(65) Prior Publication Data

US 2021/0043869 A1 Feb. 11, 2021

(30) Foreign Application Priority Data

Aug. 7, 2019 (KR) ........................ 10-2019-0096136

(51) Int. Cl.
*H01L 51/00* (2006.01)
*H01L 51/44* (2006.01)
(Continued)

(52) U.S. Cl.
CPC ........ *H01L 51/5253* (2013.01); *H01L 51/448* (2013.01); *H01L 51/502* (2013.01);
(Continued)

(58) Field of Classification Search
CPC . H01L 51/5253; H01L 51/448; H01L 51/502; H01L 2251/301; H01L 51/5256;
(Continued)

(56) References Cited

U.S. PATENT DOCUMENTS 4,888,247 A * 12/1989 Zweben ................. B32B 15/08
428/105
8,349,521 B2 * 1/2013 Tamura ................. C01G 25/02
429/528

(Continued)

FOREIGN PATENT DOCUMENTS

KR 1020190026229 3/2019

OTHER PUBLICATIONS

Jeong, et al. "Textile-based washable polymer solar cells for optoelectronic modules: toward self-powered smart clothing" Energy Environ. Sci., Jan. 18, 2019, 12 pages.

*Primary Examiner* — Ida M Soward
(74) *Attorney, Agent, or Firm* — Mayer & Williams, PC; Stuart H. Mayer

(57) ABSTRACT

A washable nano-stratified encapsulation barrier is provided. The washable nano-stratified encapsulation barrier includes a stratified inorganic layer including an aluminum oxide layer, and a silica-polymer layer provided in direct contact with the aluminum oxide layer and having silicon (Si)-oxygen (O) bond. An electronic device is provided. The electronic device comprises a substrate; the washable nano-stratified encapsulation barrier and provided on the substrate; and an organic electronic device provided on the substrate.

9 Claims, 15 Drawing Sheets

(51) Int. Cl.
*H01L 51/52* (2006.01)
*H01L 23/10* (2006.01)
*H01L 51/50* (2006.01)

(52) U.S. Cl.
CPC .......... *H01L 23/10* (2013.01); *H01L 51/0097* (2013.01); *H01L 51/5237* (2013.01); *H01L 51/5256* (2013.01); *H01L 2251/301* (2013.01); *H01L 2251/303* (2013.01); *H01L 2251/5338* (2013.01)

(58) Field of Classification Search
CPC ............. H01L 51/5237; H01L 51/0097; H01L 2251/5338; H01L 2251/303; H01L 23/10
See application file for complete search history.

(56) References Cited

U.S. PATENT DOCUMENTS

| | | | |
|---|---|---|---|
| 8,545,708 B2* | 10/2013 | Fujii | G02B 1/118 216/11 |
| 2005/0189846 A1* | 9/2005 | Saito | H03H 9/02094 310/311 |
| 2013/0045374 A1* | 2/2013 | Yu | H01L 51/5256 428/220 |
| 2015/0221891 A1* | 8/2015 | Ghosh | C23C 28/04 257/40 |
| 2020/0274102 A1* | 8/2020 | Choi | H01L 51/56 |

\* cited by examiner

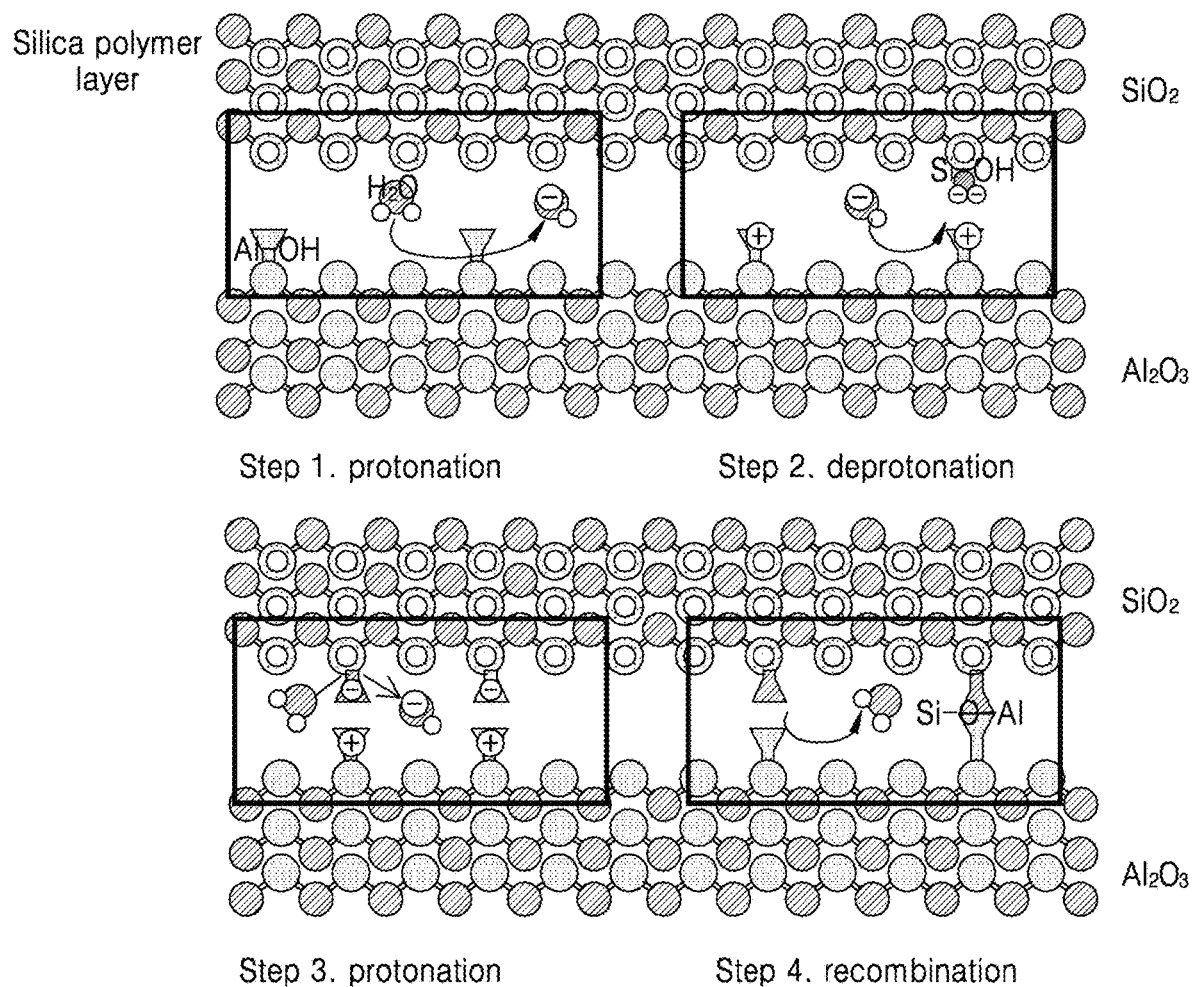

US 11,283,047 B2

WASHABLE NANO-STRATIFIED ENCAPSULATION BARRIER AND ELECTRONIC DEVICE INCLUDING THE SAME

CROSS-REFERENCE TO RELATED PATENT APPLICATION

This application claims the benefit of Korean Patent Application No. 10-2019-0096136, filed on Aug. 7, 2019, in the Korean Intellectual Property Office, the disclosure of which is incorporated herein in its entirety by reference.

BACKGROUND

1. Field

The present invention relates to an encapsulation barrier and an electronic device including the same and, more particularly, to a washable nano-stratified encapsulation barrier and an electronic device including the same.

2. Description of the Related Art

When exposed to an external environment, organic electronic devices including a material vulnerable to moisture and oxygen rapidly deteriorate. Therefore, an encapsulation technology for protecting the organic electronic devices from external moisture and oxygen is an essential choice. A conventional encapsulation technology works properly at room temperature but loses its characteristics in a humid environment. That is, the organic electronic devices may not be sufficiently protected in rainy days or when washed. This problem needs to be solved for applicability to wearable organic electronic devices which require washing and daily basis use.

SUMMARY

The present disclosure provides a washable nano-stratified encapsulation barrier and an electronic device including the same.

According to an aspect of the present invention, there is provided a washable nano-stratified encapsulation barrier including a stratified inorganic layer including an aluminum oxide layer, and a silica-polymer layer provided in direct contact with the aluminum oxide layer and having silicon (Si)-oxygen (O) bond.

The silica-polymer layer may prevent phase transition of the aluminum oxide layer.

The aluminum oxide layer may have an amorphous structure, and the silica-polymer layer may prevent phase transition of the aluminum oxide layer from the amorphous structure to a crystalline structure.

The silica-polymer layer may include a cycloaliphatic epoxy oligosiloxane resin having Si—O bond.

The silica-polymer layer may include a $SiO_2$-polymer composite having Si—O bond.

The stratified inorganic layer may further include a material layer including at least one material selected from the group consisting of zinc oxide, zirconium oxide, titanium oxide, magnesium oxide, tungsten oxide, zinc sulfide, yttrium oxide, hafnium oxide, silicon oxide, silicon nitride, silicon oxynitride, aluminum nitride, magnesium fluoride, titanium nitride, hafnium nitride, and zirconium nitride.

According to another aspect of the present invention, there is provided an electronic device including a substrate, the above-described washable nano-stratified encapsulation barrier provided on the substrate, and an organic electronic device provided on the substrate.

The substrate may include at least one of fiber, textile, plastic, and a release liner.

The organic electronic device may include a polymer solar cell (PSC) device, an organic light-emitting diode (OLED) device, a quantum dot (QD) device, or a perovskite device.

BRIEF DESCRIPTION OF THE DRAWINGS

The above and other features and advantages of the present invention will become more apparent by describing in detail embodiments thereof with reference to the attached drawings in which:

FIG. 1A shows an attachable barrier, FIG. 1B shows that the attachable barrier is separated from release liner polyethylene terephthalate (PET), and FIG. 1C shows that the attachable barrier is attached to an optoelectronic module without an additional curing process;

FIG. 6A shows the protonation-deprotonation mechanism between $SiO_2$ polymer capping and ALD deposited $Al_2O_3$, according to an experimental example of the present invention;

DETAILED DESCRIPTION

Figure 1A:
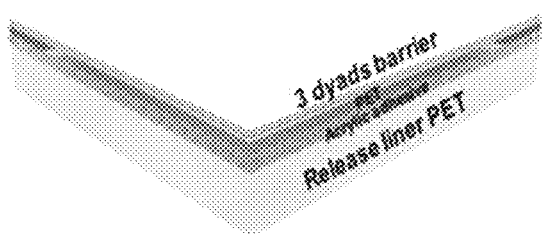
FIGS. 1A, 1B and 1C show images of an attachable encapsulation process according to an experimental example of the present invention, and more specifically.

Hereinafter, the present invention will be described in detail by explaining embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art.

A washable nano-stratified encapsulation barrier according to an embodiment of the present invention includes a stratified inorganic layer including an aluminum oxide layer, and a silica-polymer layer provided in direct contact with the aluminum oxide layer and having silicon (Si)-oxygen (O) bond. The silica-polymer layer may prevent phase transition of the aluminum oxide layer. The aluminum oxide layer may have an amorphous structure, and the silica-polymer layer may prevent phase transition of the aluminum oxide layer from the amorphous structure to a crystalline structure.

In the washable nano-stratified encapsulation barrier, the silica-polymer layer may include a cycloaliphatic epoxy oligosiloxane resin having Si—O bond. Alternatively, the silica-polymer layer may include a $SiO_2$-polymer composite having Si—O bond.

In the washable nano-stratified encapsulation barrier, the stratified inorganic layer may further include a material layer including at least one material selected from the group consisting of zinc oxide, zirconium oxide, titanium oxide, magnesium oxide, tungsten oxide, zinc sulfide, yttrium oxide, hafnium oxide, silicon oxide, silicon nitride, silicon oxynitride, aluminum nitride, magnesium fluoride, titanium nitride, hafnium nitride, and zirconium nitride.

An electronic device according to another embodiment of the present invention includes a substrate, the above-described washable nano-stratified encapsulation barrier provided on the substrate, and an organic electronic device provided on the substrate. The substrate may include at least one of fiber, textile, plastic, and a release liner. The organic electronic device may include a polymer solar cell (PSC) device, an organic light-emitting diode (OLED) device, a quantum dot (QD) device, or a perovskite device.

An encapsulation technology may generally include a first technology using an encapsulation barrier having a laminated structure of organic and inorganic layers, a second technology using a nanolaminate encapsulation barrier obtained by alternately depositing different inorganic layers, and a third technology using a nano-stratified encapsulation barrier having a combination of the structure of the first technology and the structure of the second technology. Up to now, such technologies were mostly used by selecting, for the encapsulation barrier, a material capable of achieving a low water vapor transmission rate (WVTR) or a material capable of increasing flexibility. Particularly, aluminum oxide which has the highest moisture permeability from among inorganic materials was used for most encapsulation barriers, and an organic material was selected in most cases for flexibility of the encapsulation barriers. However, aluminum oxide undergoes phase transition due to hydration and thus loses its superior characteristics in an aqueous environment, for example, when washed. In addition, the organic material basically has poor encapsulation characteristics. As such, the conventional technologies have limitations in application to wearable devices.

An embodiment of the present invention proposes a method of using, as an organic material, a silica-polymer solution including multiple Si—O bonds capable of preventing hydration of an inorganic material. For example, the present invention proposes a method of fabricating a washable encapsulation barrier capable of preventing hydration in a humid environment by using a silica-polymer solution having multiple Si—O bonds, for a stratified inorganic layer including an aluminum oxide layer. According to the present invention, because an encapsulation barrier may be fabricated using a simple deposition method and be directly formed on various substrates, e.g., fiber or textile substrates directly used for wearable devices or plastic substrates indirectly used for wearable devices, a washable encapsulation barrier appropriate for wearable organic electronic devices may be fabricated.

In the basic form of the present invention, ultra-thin laminated inorganic layers serving as a main barrier may be based on aluminum oxide having excellent encapsulation characteristics and be laminated with other inorganic layers. However, this structure causes hydration and phase transition of aluminum oxide in a humid environment. When phase transition occurs, amorphous aluminum oxide is transited to a crystalline structure and thus moisture permeation is increased and a barrier function is lost. The phase transition may be observed based on changes in Fourier transform infrared absorption (FT-IR) and surface roughness.

In the present invention, an encapsulation barrier was fabricated by depositing, through spin-coating, a silica-polymer solution having multiple Si—O bonds to prevent phase transition of aluminum oxide not to lose a barrier function in any environment. In this case, aluminum oxide chemically reacts with the silica-polymer solution in a humid environment and thus phase transition thereof is prevented. When the fabricated encapsulation barrier was dipped in water, no changes in thickness and surface roughness were observed. This washable encapsulation barrier may be fabricated on all of fibers, textiles, plastic, and various release liners and thus be directly or indirectly applicable to organic electronic devices. When applied to PSCs and OLEDs on a textile substrate and then washed, the encapsulation barrier of the present invention maintained its characteristics even after 20 repeated washing cycles. Depending on application, the encapsulation barrier of the present invention may be fabricated on various substrates such as textile, fiber, plastic, or a release liner and be attached to organic electronic devices, or may be directly formed on organic electronic devices. The encapsulation barrier of the present invention may be applied not only to organic electronic devices but also to other devices requiring an encapsulation barrier. In addition, depending on application, the encapsulation barrier of the present invention may be used not only for wearable devices but also for transparent devices and flexible devices. According to the present invention, using a washable encapsulation barrier, ultimate wearable organic electronic devices freely usable in daily routines beyond existing wearable organic electronic devices may be implemented. Chemical reaction between the silica-polymer solution and aluminum oxide in the encapsulation barrier proves that deterioration of the encapsulation barrier may be prevented. In addition, the form of a nano-stratified encapsulation barrier proves that an encapsulation barrier having high moisture permeability and appropriate for flexibility may be fabricated.

Experimental Examples

Experimental examples will now be described to promote understanding of the present invention. However, the following experimental examples are merely for better understanding of the present invention and the scope of the present invention is not limited thereto.

Fabrication of the Encapsulation Barrier

Aluminum oxide ($Al_2O_3$) and zinc oxide (ZnO) were used as materials to form a stratified inorganic layer. The two materials were deposited by thermal atomic layer deposition (ALD) in a 70° C. chamber. $Al_2O_3$ was prepared using trimethylaluminum (TMA) and $H_2O$, ZnO was prepared using diethylzinc (DEZ) and $H_2O$. The ALD cycle was composed by 0.2 seconds of precursor (TMA or DEZ) pulse, 10 seconds of $N_2$ purge, 0.2 seconds of reactant ($H_2O$) pulse, and an $N_2$ purge process for 10 seconds. The 30 nm stratified inorganic layer was composed of 5 pairs of $Al_2O_3$ (3 nm) and ZnO (3 nm). Polyvinyl alcohol (PVA), $P_{low,SiO2}$, and $P_{high,SiO2}$ were used as the polymers, forming the basic structure of the nano-stratified encapsulation barrier, and they were deposited via spin-coating. $P_{low,SiO2}$, a cycloaliphatic epoxy oligosiloxane resin, was synthesized by the sol-gel method, which is based on 2-(3,4-epoxycyclohexyl) ethyl trimethoxysilane (ECTS) and diphenyl silanediol (DPSD) and $P_{high,SiO2}$, a $SiO_2$-polymer composite (i-OPTO BC 10, INTECH Nano Materials Co., Ltd, Korea), based on Si:glycidoxy-propyl trimethoxysilane (Si:GPTMS) and tetraethyl orthosilicate (TEOS) was synthesized by the sol-gel method. For the PVA, the polymer layer undergoes a thermal curing process of 70° C. for 10 minutes while the $SiO_2$ polymer ($P_{high,SiO2}$) has 20 minutes curing time. Epoxy oligosiloxane resin ($P_{low,SiO2}$) undergoes an ultraviolet (UV) curing process with I-line UV ($\lambda$=365 nm, optical power density=20 mW $cm^{-2}$) for 100 seconds.

PSC Fabrication

The PSCs were fabricated on a barrier-coated textile substrate with the following structure: textile substrate/bottom encapsulation barrier/silver (Ag) cathode (100 nm)/PFN (electron transporting layer, 8 to 10 nm)/PTB7-Th:$PC_{71}BM$ (active layer, 100 to 110 nm)/$MoO_3$ (hole transporting layer, 10 nm)/Ag anode (10 nm)/$MoO_3$ (optical capping layer, 30 nm). At this time, the PSC was designed with a top-illuminated and inverted structure that receives light through the upper electrode, because the textile substrate is opaque. It showed superior stability compared to the conventional structure. For efficient electron injection, poly (9,9-bis(3'-(N,N-dimethylamino)propyl)-2,7-fluorene)-alt-2,7-(9,9-dioctylfluorene) (PFN, 1-material) was thinly formed on the Ag cathode by spin-coating. In addition, 8 mg $mL^{-1}$ of poly[4,8-bis[5-(2-ethylhexyl)thiophen-2-yl]benzo [1,2-b:4,5-b']dithiophene-2,6-diyl-alt-3-fluoro-2-[(2-ethylhexyl)carbonyl]thieno[3,4-b]thiophene-4,6-diyl] (PTB7-Th, 1-material) and 12 mg $mL^{-1}$ of (6,6)-phenyl C71 butyric acid methyl ester ($PC_{71}BM$, Nano-C) were dissolved in a mixed solvent (chlorobenzene:1,8-diiodoctane (97:3 by volume)) for the active layer. The active layer was deposited by spin-coating at 1000 rpm for 120 seconds. After drying for 30 minutes in a $N_2$ glove box, a transparent DMD (dielectric/metal/dielectric) electrode having a structure of $MoO_3$/Ag/$MoO_3$ was prepared by the thermal evaporation method. All the thermal evaporation was performed at an average vacuum of $1\times10^{-6}$ Torr.

OLED Fabrication

The top-emission type OLEDs were fabricated on the barrier-coated textile substrate with the following structure: textile substrate/bottom encapsulation barrier/aluminum (Al) cathode (100 nm)/Liq (1 nm)/$Bebq_2$:Ir(piq)$_3$ (70 nm)/NPB (65 nm)/$MoO_3$ (5 nm)/Ag anode (30 nm)/NPB (50 nm). The Al cathode and 8-hydroxyquinolinolato-lithium (Liq) were used as an electron-injection layer. The bis(10-hydroxybenzo[h]quinolinato)beryllium complex ($Bebq_2$) and tris(1-phenylisoquinoline)iridium (Ir(piq)3), which is a red emission dopant, were co-deposited for an emitting layer. For the hole-transport layer, N,N'-bis(1-naphthyl)-N,N'-diphenyl-1,1'-biphenyl-4,4'-diamine (NPB) was used, while molybdenum trioxide ($MoO_3$) was used for the hole-injection layer. A semitransparent silver layer with an NPB optical capping layer was used for the anode. The whole layers were made by thermal evaporation with an average vacuum of $1\times10^{-6}$ Torr.

Encapsulation of Optoelectronic Modules

Figure 1B:
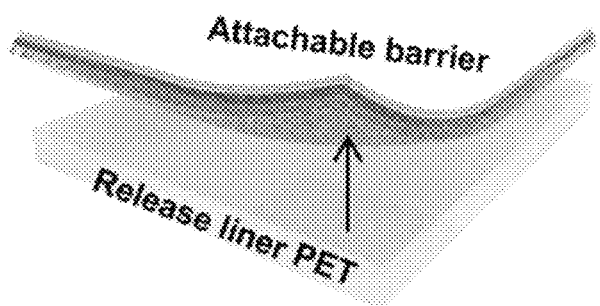
Figure 1C:
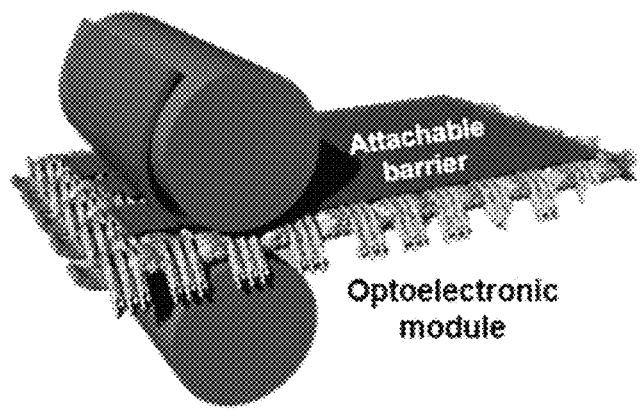

Finally, 3 dyads of functional encapsulation barrier were fabricated on 60 μm attachable polyethylene terephthalate (PET) containing 3.5 μm PET substrate, 6.5 μm acrylic adhesive (600 gf/25 mm) and 50 μm release liner PET (see FIG. 1A). The encapsulation barrier is easily attached to the device via acrylic adhesive without an additional curing process since its adhesive force is strong (see FIGS. 1B and 1C). The optoelectronic modules fabricated on the textile substrate are simultaneously protected by the attachable encapsulation, which is separated from the release liner PET. For external connection of the optoelectronic modules, the thermally deposited metal electrode of the device and a conductive fiber were connected using a conductive paste. In addition, the external connection between the device electrode and conductive fiber was effectively protected because an attachable encapsulation film was attached over the external connection area.

Characterization

The electrical calcium test utilizing the high reactivity of calcium metal was used to measure WVTR with the following steps. A 100 nm thick Al electrode was thermally evaporated on a glass substrate and then a calcium pad having a thickness of 250 nm was fabricated to have a size of 1.5 $cm^2$ which is the same as the moisture permeation area. Then the calcium pad was sealed using a barrier deposited superstrate with a UV-curable sealant (XNR 5570-Ba, Nagase Chemtex, Japan). The vacuum in the thermal evaporation process was at the level of $1 \times 10^{-6}$ Torr and all experiments were conducted in a glove box in a $N_2$ environment. Finally, changes in resistance were observed in real time using a sheet resistance measuring device (Keithley 2750, USA) connected in the chamber, which can control and maintain the temperature and humidity. Based on the electrical corrosion of calcium metal generated as the reaction between the calcium metal and moisture and oxygen progresses, WVTR can be calculated. The photoluminescence (PL) measurement continued using fluorescence spectroscopy (FluoroMate FS-2, SCINCO, Korea) with a 150 W ozone free xenon (Xe) lamp. The measured sample was fabricated on a glass substrate with a thickness of 30 nm. Next, FT-IR was measured using the attenuated total reflection (ATR) mode of an infrared spectrophotometer (IFS 66 V/S & Hyperion 3000, Bruker, Germany). In the course of the experiment, thickness and surface roughness were measured via the elliptical polarization method (M2000 D, Woollam, USA) and an atomic force microscope (XE-100, Park Systems, Korea) respectively. Samples used for FT-IR, ellipsometry and atomic force microscopy measurements were fabricated on Si wafers. The electrical characteristics of the fabricated wearable PSCs were measured using a solar simulator (K201 LAB 55, McScience Inc., Korea) via a filter, while a source meter (Keithley 2400, USA) and a spectrophotometer (CS-2000, Konica Minolta, Japan) were used to measure the characteristics of the OLEDs. Finally, washing experiments were conducted using a neutral liquid detergent (Aquet, Bel-Art, USA) without phosphate, and bending experiments were conducted on a customized bending machine (ST1, Korea).

Result and Discussion

Figure 2A:
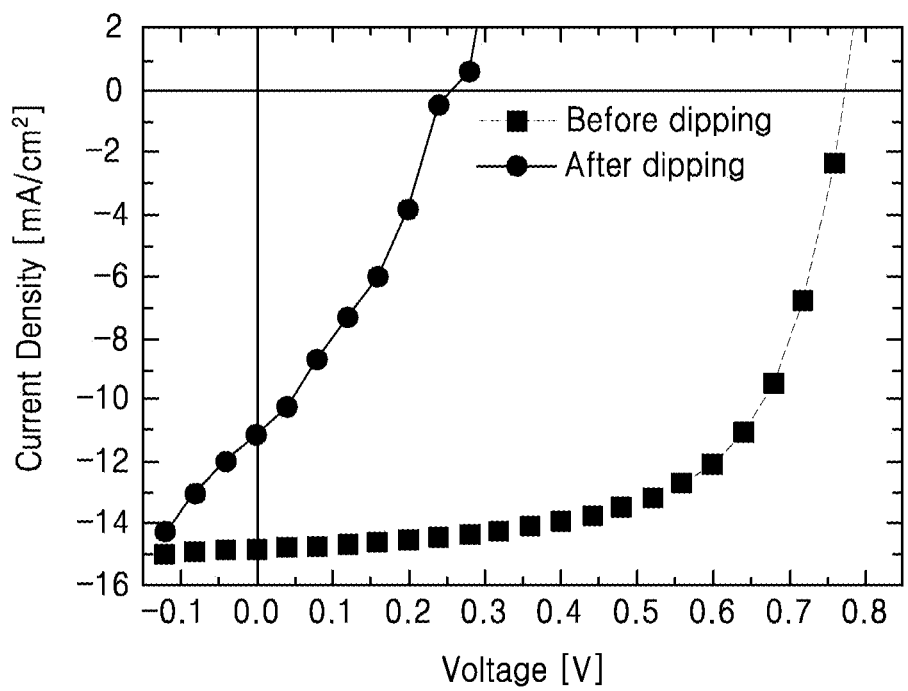
FIG. 2A shows current-voltage (J-V) curves of polymer solar cells (PSCs) before and after dipping to show the effect of dipping into water, according to an experimental example of the present invention.

It is known that PSCs are vulnerable to moisture and oxygen because of the polymer material used as the light absorption layer. PSCs without functional encapsulation no longer work when dipped under water (see FIG. 2A). A stratified inorganic layer composed of ALD-$Al_2O_3$ and atomic layer deposited zinc oxide (ALD-ZnO) is currently regarded as one of the next generation encapsulation barriers because of its low WVTR and high flexibility. Unlike other atomic layer deposited oxide layers (ALD-oxides), the ALD-ZnO layer provides mechanical stability to the nano-stratified barrier through a crack arresting behavior, provided by the Zn etching process. Also, DEZ, the precursor of ALD-ZnO, works as a reaction enhancer for ALD-$Al_2O_3$ growth because of its hydrophobic surface, which prevents the $H_2O$ retention phenomenon. However, the ZnO layer also contains oxygen vacancies, which occur during deposition. Since an oxygen vacancy can provide a diffusion path for external moisture and oxygen, it causes the encapsulation barrier to have a high WVTR. However, a substitution reaction, which eliminates the oxygen vacancy, happens in the stratified inorganic layer because of the ALD-$Al_2O_3$ layer. The defect peak of the ALD-ZnO layer was not found in the stratified inorganic layer. This means that the stratified inorganic layer is denser than other single layers which results in a low WVTR. For these reasons, the stratified inorganic layer is suitable as the unit structure of an encapsulation barrier in ambient atmosphere. Unfortunately, the stability of ALD-$Al_2O_3$ is poor in aqueous environments.

Figure 2B:
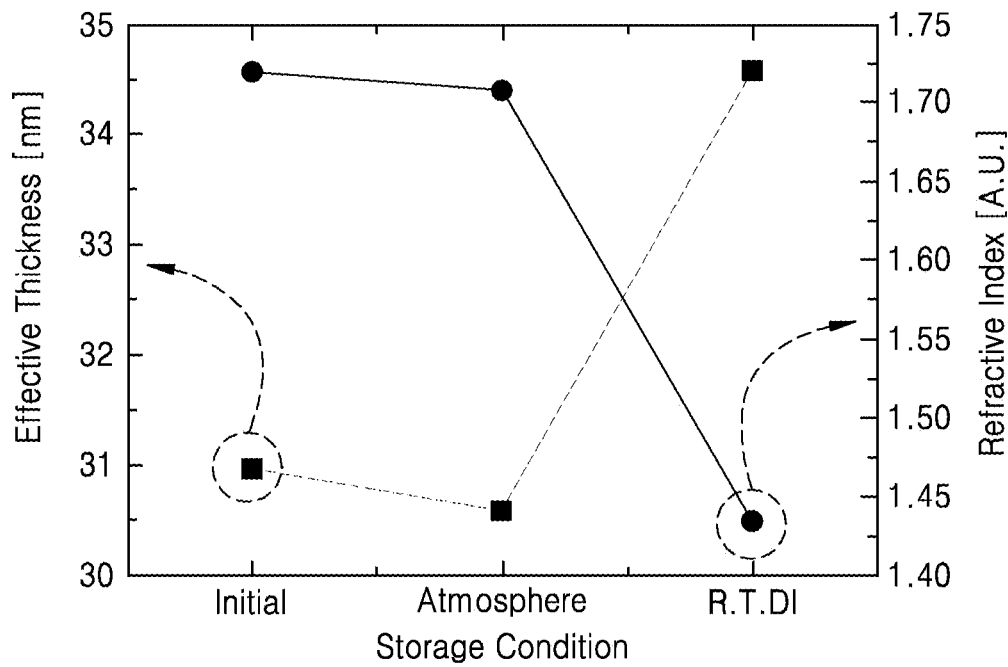
FIG. 2B shows ellipsometric analysis (an effective thickness and a refractive index according to various storage conditions) of a nano-stratified layer to show the effect of dipping into water.

Since the wearable devices must be durable in aqueous environments, such as rainy days and washing, the degradation behavior of ALD-$Al_2O_3$ should be prevented. To analyze the degradation behavior of ALD-$Al_2O_3$ in an aqueous environment, a stratified inorganic layer was fabricated on a wafer substrate and stored in ambient atmosphere, and deionized (DI) water, for a week, respectively. Then, the thickness and optical constants of the fabricated samples were measured by the ellipsometric system. As shown in FIG. 2B, the samples stored in ambient atmosphere retained their thickness and optical constants while the samples stored in DI water showed considerable change. The detailed measurement results are reported in Table 1. Table 1 shows the change in effective thickness and refractive index of the nano-stratified layer according to various storage conditions.

TABLE 1

| Storage condition | Effective thickness (nm) | Refractive index |
| --- | --- | --- |
| As-deposited | 30.963 | 1.71991 |
| Atmosphere | 30.593 | 1.70885 |
| After dipping | 34.588 | 1.435192 |

The thickness was increased by about 16% and refractive index was decreased by about 16% for the samples stored in DI water. It was considered that these changes originated from chemical reactions rather than physical reactions, such as dissolution, because the thickness of the samples increased. Based on this consideration, Fourier transform infrared spectroscopy (FT-IR) was conducted to analyze the changes in chemical structure.

Figure 2C:
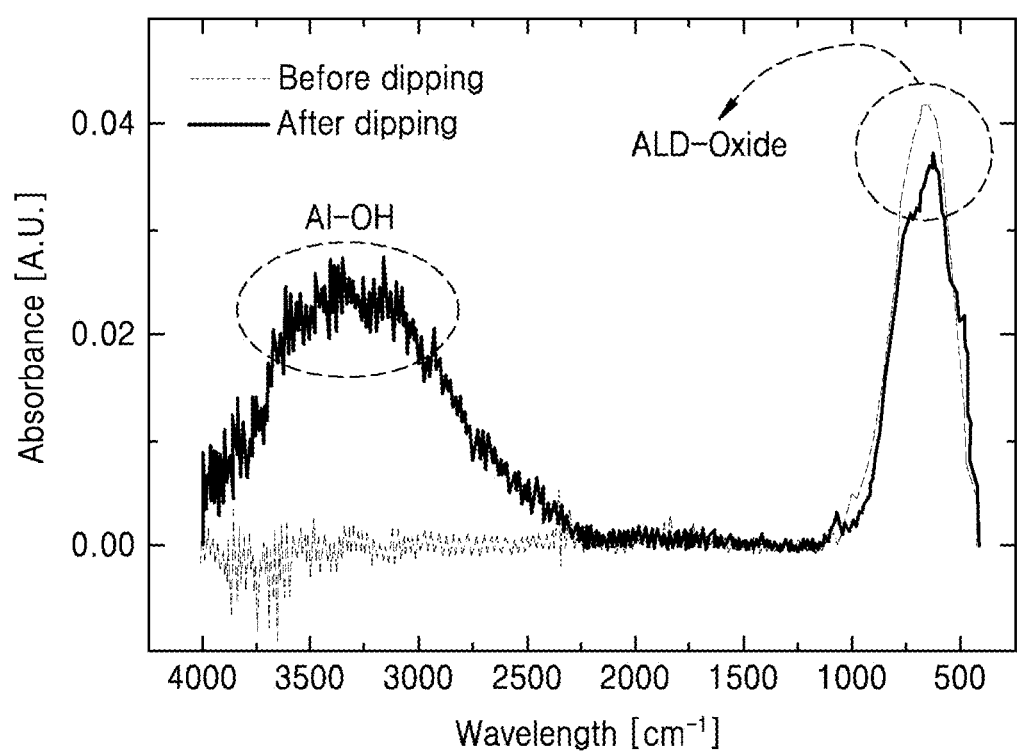
FIG. 2C shows the result of Fourier transform infrared absorption (FT-IR) measurements of the nano-stratified layer before and after dipping to show the effect of dipping into water.

There was only a single absorbance peak near 900 $cm^{-1}$ for the as-deposited sample, which is a typical frequency band for ALD-oxides, as indicated in FIG. 2C. On the other hand, for samples stored in the aqueous environment there was a new FT-IR signal that appeared at around 3300 $cm^{-1}$ which represents the stretching of Al—OH bonding. The aqueous stored sample was judged to have undergone a phase transition to boehmite because of its —OH group.

Figure 2D:
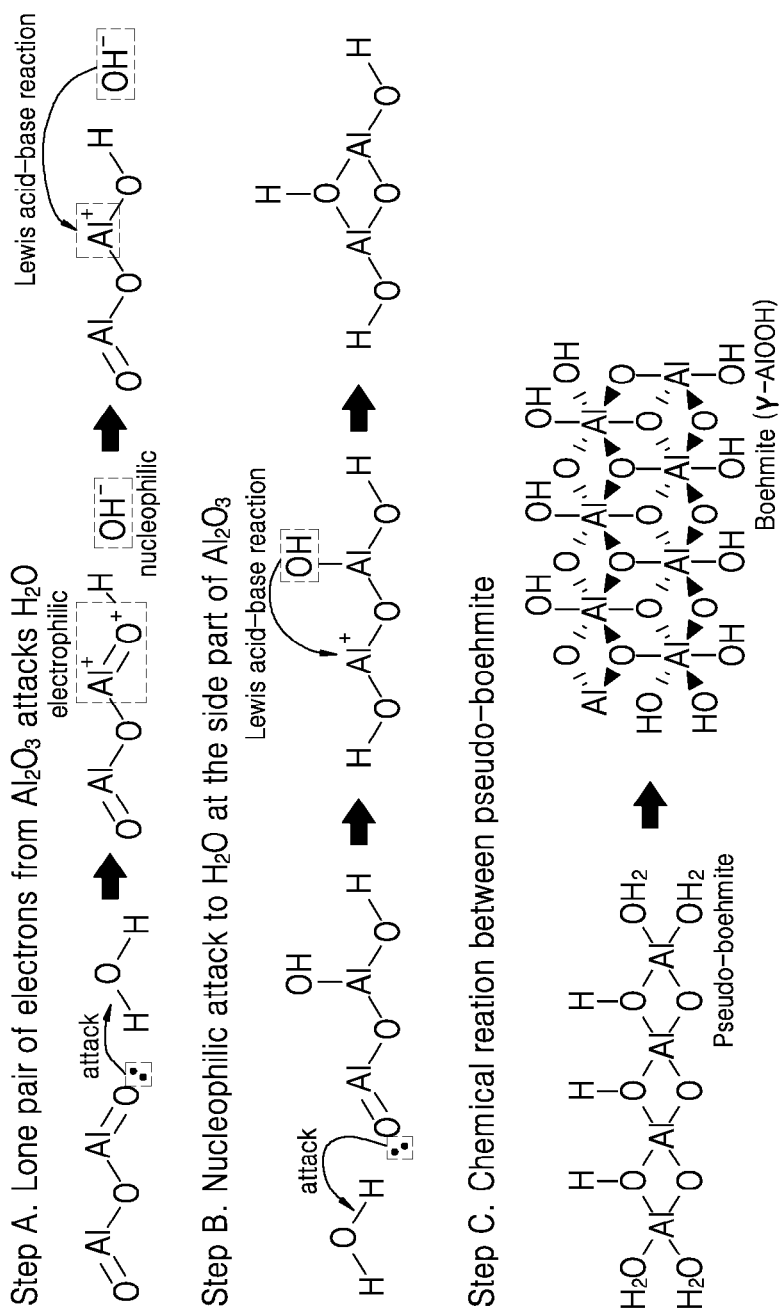
FIG. 2D shows the phase transition mechanism of atomic layer deposition (ALD) deposited $Al_2O_3$ by $H_2O$ to show the effect of dipping into water.

The chemical reaction mechanism explained in FIG. 2D illustrates the detailed process of the phase transition. First, the electron lone pair in $Al_2O_3$ attacks $H_2O$ resulting in a Lewis acid-base reaction. The intermediate product, pseudo boehmite, is formed after a nucleophilic attack on $H_2O$ that also occurs in the side part of $Al_2O_3$. The phase transition to boehmite eventually happens with the reaction between pseudo-boehmite, since the pseudo-boehmite has a positive charge on oxygen (O) while it has a negative charge on Al. Although the ALD-$Al_2O_3$ is amorphous, crystallization occurs during the phase transition to boehmite. During the phase transition, the molar volume of Al expands due to the crystallization, thereby resulting in an increase in the total thickness of the structure. In addition, since grain boundaries contained in the crystalline structure act as penetration pathways for moisture and oxygen, the WVTR will be greatly increased. This means that the phase transition of $Al_2O_3$ inside the stratified inorganic layer must be suppressed to achieve a washable encapsulation barrier.

Functional Encapsulation Barrier with $SiO_2$-Polymer Composite

Figure 3:
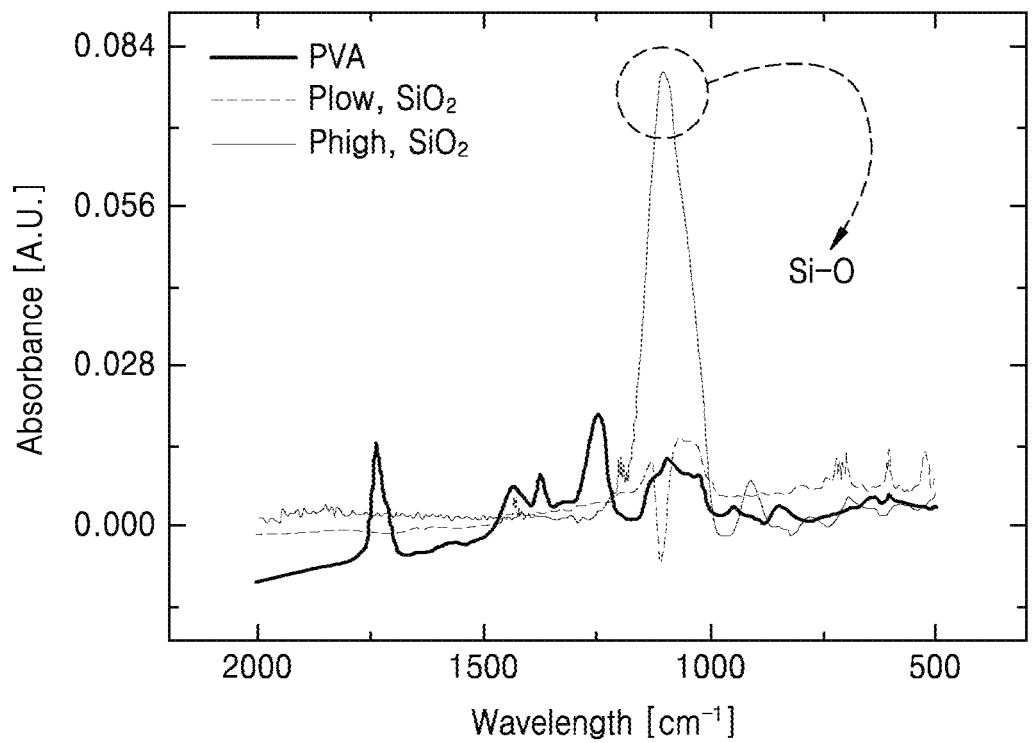
FIG. 3 shows the result of FT-IR measurements of polyvinyl alcohol (PVA), $P_{low,SiO2}$, and $P_{high,SiO2}$, according to an experimental example of the present invention.

To prevent the phase transition of $Al_2O_3$ from the viewpoint of the encapsulation barrier, there may be a method of preventing the deterioration of $Al_2O_3$ thin film by adopting vacuum deposited oxide capping layers. However, the previously used vacuum deposited oxide capping layer is fragile and difficult to apply to textile-based wearable devices. The present inventors experimentally verified that the $SiO_2$ contained in the polymer can effectively suppress the phase transition of ALD-$Al_2O_3$. To estimate the ability of $SiO_2$ to prevent the phase transition, three different polymer materials with different $SiO_2$ contents [i) $P_{no,SiO2}$: polyvinyl alcohol (PVA), ii) $P_{low,SiO2}$: cycloaliphatic epoxy oligosiloxane resin, and iii) $P_{high,SiO2}$: $SiO_2$-polymer composite] were selected and used as the capping layer. For quantitative comparison of the $SiO_2$ content in each of the polymers, FT-IR measurement was conducted. It confirmed that $P_{high,SiO2}$ had the highest Si—O bond quantity among the three candidate polymers, as shown in FIG. 3.

Figure 4A:
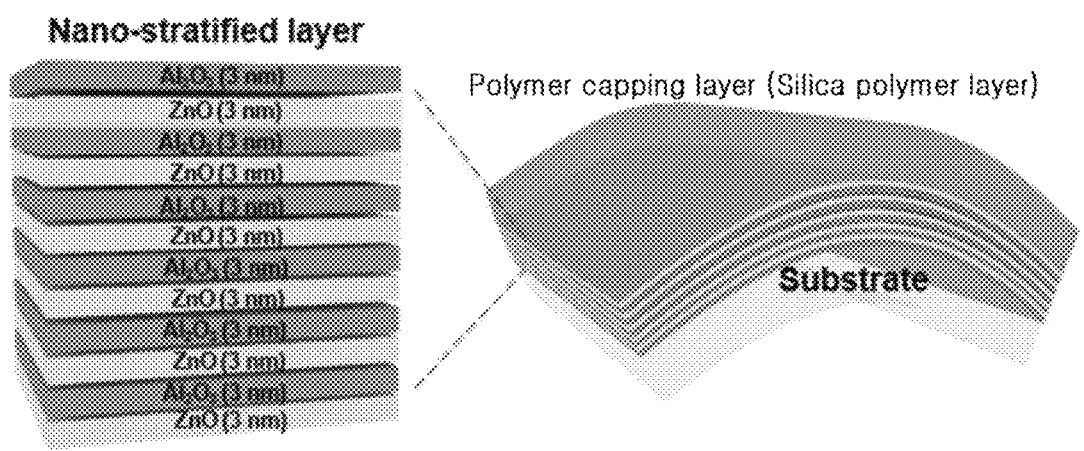
FIG. 4A is a schematic diagram of a unit dyad of a functional encapsulation barrier according to an experimental example of the present invention.
Figure 4B:
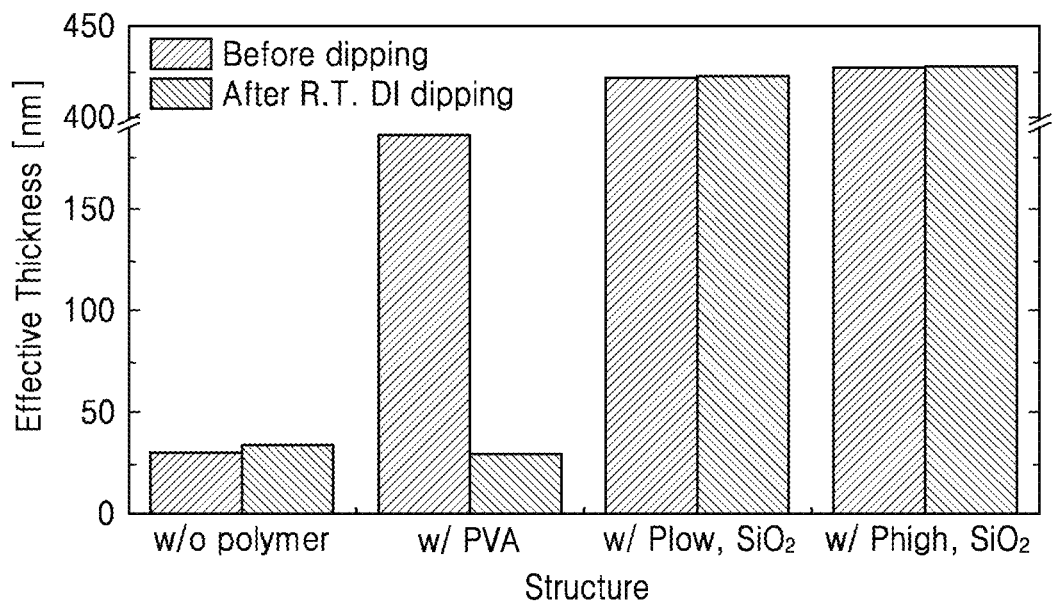
FIG. 4B shows the change of effective thickness before and after dipping according to various polymer capping layers.
Figure 4C:
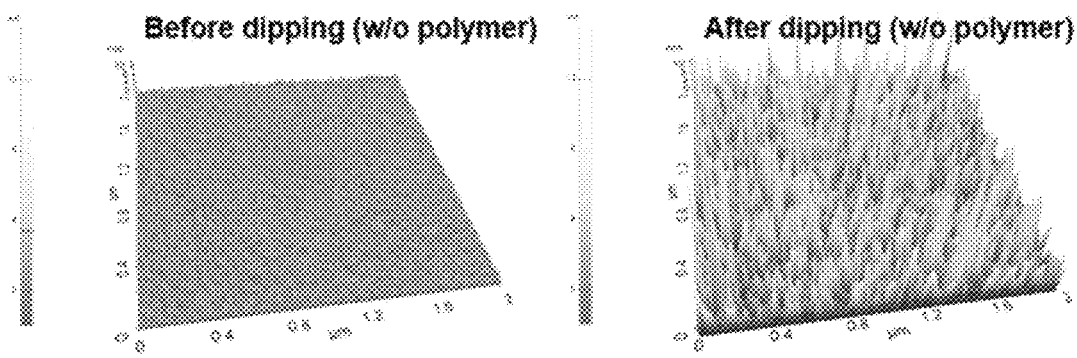
FIG. 4C shows atomic force microscopy (AFM) measurement results without a polymer capping layer before and after dipping.

A unit dyad of functional encapsulation barrier, made up of a nano-stratified layer (5 pairs of ALD-$Al_2O_3$ and ALD-ZnO) and a polymer capping layer, is illustrated in FIG. 4A. Table 2 shows the change in effective thickness and surface roughness according to various polymers. To compare barrier properties depending on the polymer capping layer, a unit dyad of nano-stratified layers with the selected polymers was fabricated and stored in an aqueous environment for a week. After storing, the barrier containing PVA showed a considerable decrease in thickness due to its water-soluble property. On the other hand, there was little thickness change in $P_{low,SiO2}$ and $P_{high,SiO2}$ which means that these polymers can act as a physical capping layer as shown in FIG. 4B and Table 2. For application as a washable encapsulation barrier, the encapsulation barrier should not only avoid being dissolved by water, but also should suppress the phase transition of $Al_2O_3$ as noted above. Since crystallization during the phase transition increases the molar volume of Al, the surface also becomes rougher, as shown in FIG. 4C and Table 2. Since the PVA was entirely dissolved by water, the surface roughness of the unit encapsulation barrier was measured for the case of $P_{low,SiO2}$ and $P_{high,SiO2}$.

TABLE 2

| Storage condition | | w/o polymer (nm) | w/PVA (nm) | w/$P_{low,SiO2}$ (nm) | w/$P_{high,SiO2}$ (nm) |
|---|---|---|---|---|---|
| Effective thickness | Before dipping | 30.963 | 186.049 | 421.811 | 427.604 |
| | After dipping | 34.588 | 30.048 | 422.517 | 428.058 |

TABLE 2-continued

| Storage condition | | w/o polymer (nm) | w/PVA (nm) | w/$P_{low,SiO2}$ (nm) | w/$P_{high,SiO2}$ (nm) |
|---|---|---|---|---|---|
| Surface roughness | Before dipping | 0.586 | N/A | 0.659 | 0.331 |
| | After dipping | 5.011 | N/A | 3.179 | 0.516 |

Figure 4D:
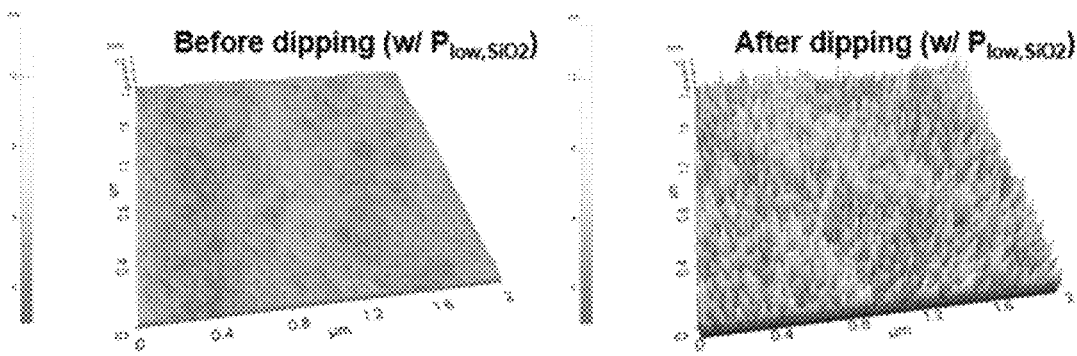
FIG. 4D shows AFM measurement results with a $P_{low,SiO2}$ capping layer before and after dipping.
Figure 4E:
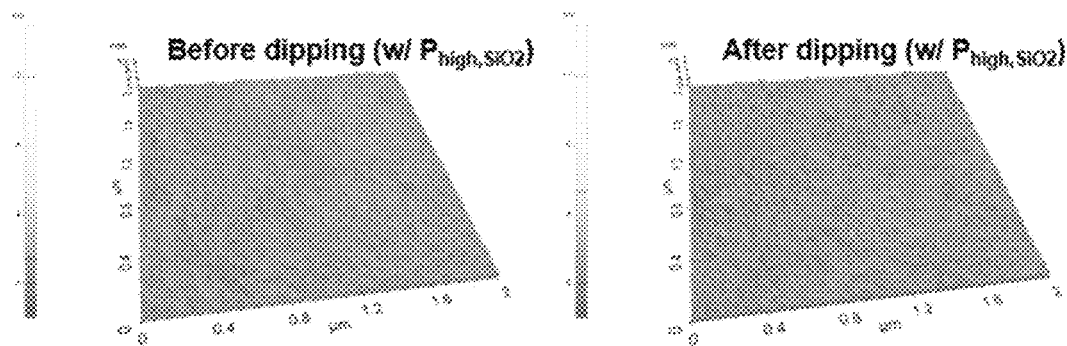
FIG. 4E shows AFM measurement results with a $P_{high,SiO2}$ capping layer before and after dipping.

As shown in FIGS. 4D and 4E and Table 2, there are quite different results for $P_{low,SiO2}$ and $P_{high,SiO2}$. In both cases, the increase in surface roughness was lower than the case without a capping layer, however, it was still rough in the case of $P_{low,SiO2}$.

The peak-to-valley roughness, which is an important factor because the encapsulation barrier acts as a superstrate on the textile substrate, was also superior in $P_{high,SiO2}$ compared to $P_{low,SiO2}$ as shown in Table 2.

Figure 5A:
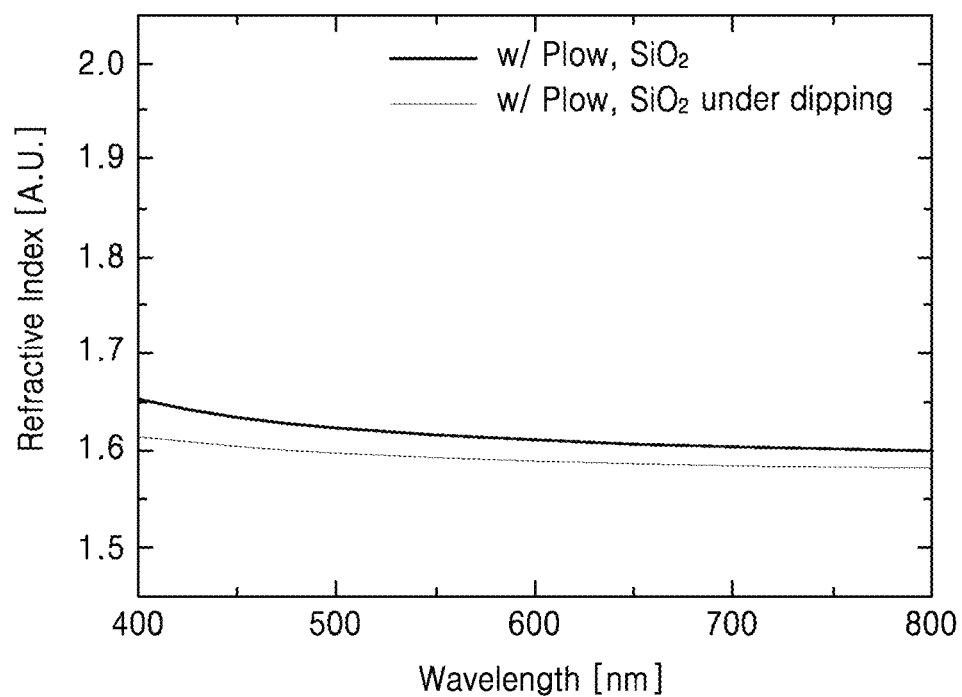
FIG. 5A shows ellipsometric analysis of an optical constant before and after dipping, according to an experimental example of the present invention.
Figure 5B:
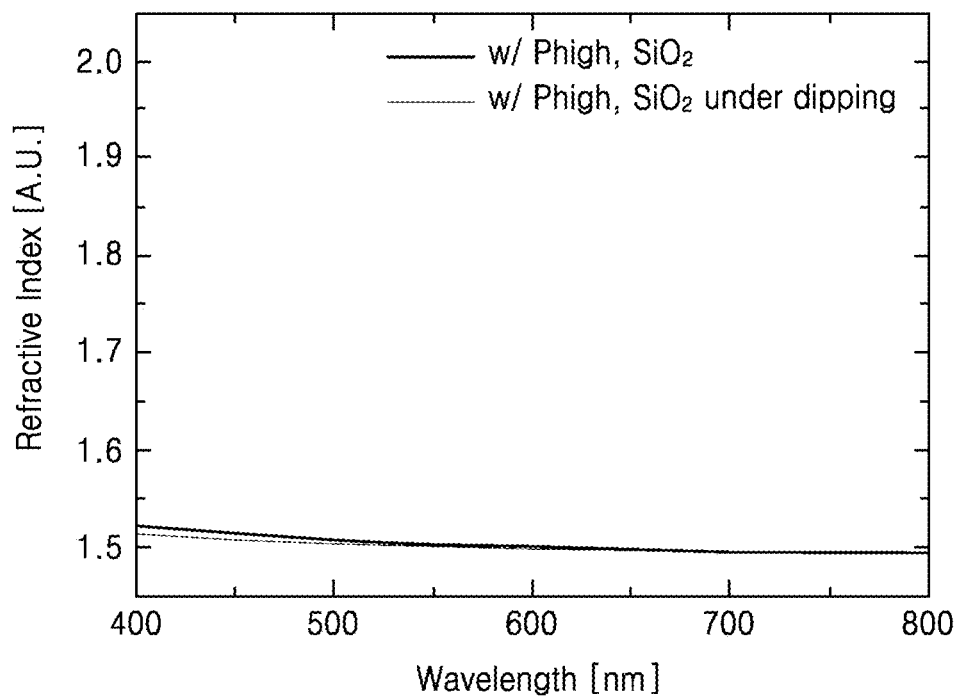
FIG. 5B shows ellipsometric analysis of an optical constant before and after dipping, according to an experimental example of the present invention.

It is also clear, from FIGS. 5A and 5B, that the change in the optical constant of the barriers with $P_{low,SiO2}$ and $P_{high,SiO2}$ showed the same tendency as their change in thickness. On the basis of these measurements, as theoretically expected, it was determined that the higher the $SiO_2$ content in the polymer was, the more the phase transition was effectively prevented.

FIG. 6A shows the theoretical mechanism explaining how $SiO_2$ contained in the polymer as a capping layer inhibits the phase transition. As the dyad of the encapsulation barrier was submerged in DI water, adsorption of water occurs on the ALD-$Al_2O_3$ surface and $SiO_2$ surface. The surface of the ALD-$Al_2O_3$ becomes hydroxylated because it possesses strong basic hydroxyl groups, formed during ALD deposition. Consequently, the hydroxylated ALD-$Al_2O_3$ surface is positively charged by protons (H+) from the dissociation of water. In summary, two electrons from the oxygen atom bond to H+, yielding a protonated Al intermediate as described by Reaction 1, where the asterisk represents a surface Al atom.

$$Al^*{-}OH + H_2O \rightarrow Al^*{-}OH_2^+ + OH^- \qquad \text{[Reaction 1]}$$

With the basicity of the formed hydroxide (OH⁻), the dissolution of silicon oxides and the deprotonation process, and the formation of dihydrogen silicate, occur as in Reaction 2.

$$SiO_2 + 2OH^- \rightarrow SiO_2(OH)_2^{2-} \qquad \text{[Reaction 2]}$$

$$SiO_2(OH)_2^{2-} + H_2O \rightarrow SiO(OH)_3^- + OH^- \qquad \text{[Reaction 3]}$$

However, immediately, another protonation process (Reaction 3) readily proceeds on the surface of the ALD-$Al_2O_3$ because the silicic acid is slightly acidic while the surface is basic. As the reactions are assumed to occur under water, it is clear that all the products easily diffuse into the surrounding area. Due to the diffusion of the products, the hydroxylated ALD-$Al_2O_3$ surface can undergo more than one silicification reaction, and Reaction 4 is one of the basic processes.

$$SiO(OH)_3^- + Al{-}OH_2^+ \rightarrow Al{-}O{-}Si(OH)_3 + H_2O \uparrow \qquad \text{[Reaction 4]}$$

With this silicification process which contains the strong intermolecular condensation of Si—O—Si, an inert passivation silicon oxide ($SiO_X$) capping layer is formed on the surface of ALD-$Al_2O_3$ as shown in Reaction 5.

$$Al{-}O{-}Si(OH)_3 + 3(HO)Si{-}O{-}Al \rightarrow Al{-}O{-}Si(OH)_3{-}O{-}_2(HO)Si{-}O{-}Al + H_2O \uparrow \qquad \text{[Reaction 5]}$$

Although the formed $SiO_X$ capping layer is re-dissolved depending on hydrothermal conditions, another capping layer, which also prevents the phase transition by protecting the Al—O—Al bond, will be formed, since the dissolving product must be another kind of silicic acid. From this chemical mechanism, it can be understood why the high $SiO_2$ content polymer shows the best performance as a capping layer and suppresses the phase transition, since it involves both physical and chemical effects.

On the other hand, it is generally known that the encapsulation barrier should have at least $10^{-5}$ g m$^{-2}$ day$^{-1}$ level of WVTR for organic-based electronics. Unfortunately, the WVTR of a unit dyad of the proposed encapsulation barrier was estimated to be $1.47 \times 10^{-4}$ g m$^{-2}$ day$^{-1}$, which is not enough for devices.

TABLE 3

| Number of dyad | WVTR |
|---|---|
| 1 dyad | $(1.47 \pm 0.62)^a \times 10^{-4}$ gm$^{-2}$day$^{-1}$ |
| 2 dyads | $(6.87 \pm 0.96) \times 10^{-5}$ gm$^{-2}$day$^{-1}$ |
| 3 dyads | $(1.18 \pm 0.44) \times 10^{-5}$ gm$^{-2}$day$^{-1}$ |

Figure 6B:
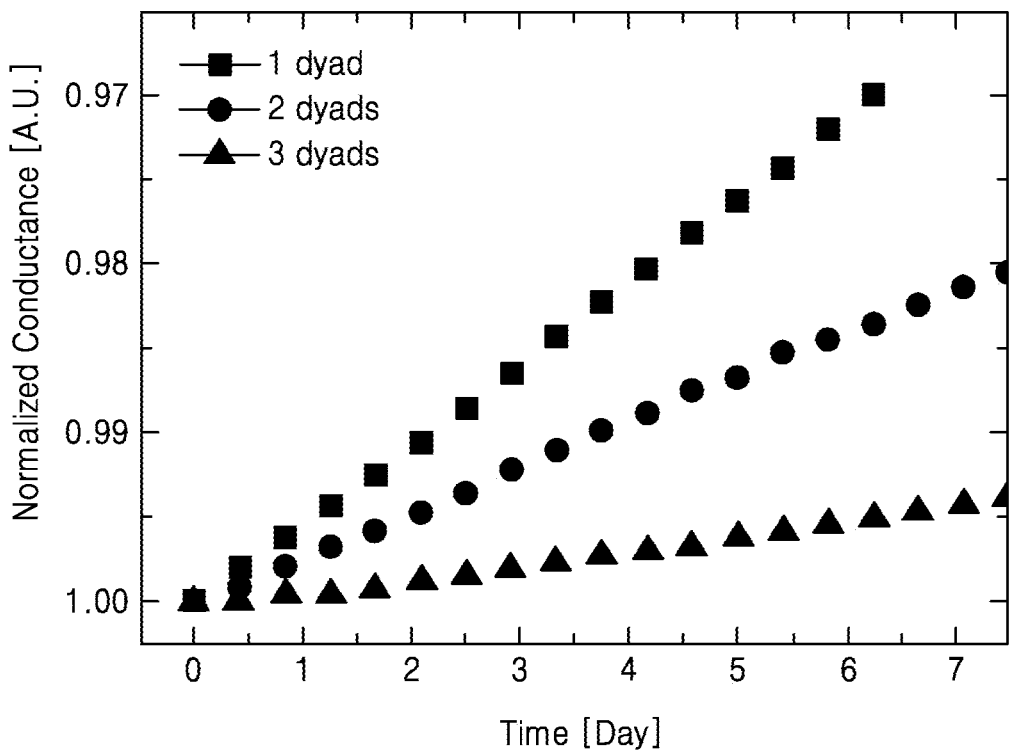
FIG. 6B is a normalized conductance vs. time graph for various dyads of functional encapsulation barrier, as an electrical calcium test result according to an experimental example of the present invention.

Table 3 represents the calculated WVTR based on FIG. 6B, which indicates the change in normalized conductance over time.

In conclusion, 3 dyads of nano-stratified layer and $SiO_2$ polymer were adopted as the final structure of the encapsulation barrier. In summary, the role of each material in the encapsulation barrier is as follows: the nano-stratified layer is the main gas barrier, with high flexibility provided by a reaction between ALD-$Al_2O_3$ and ALD-ZnO as described in Reaction 6. The $SiO_2$ polymer makes the barrier a washable one by preventing its phase transition.

$$ZnOH^* + Al(CH_3)_3 \rightarrow Al(OH)(CH_3)^* + Zn(CH_3)_2 \quad [\text{Reaction 6}]$$

Figure 6C:
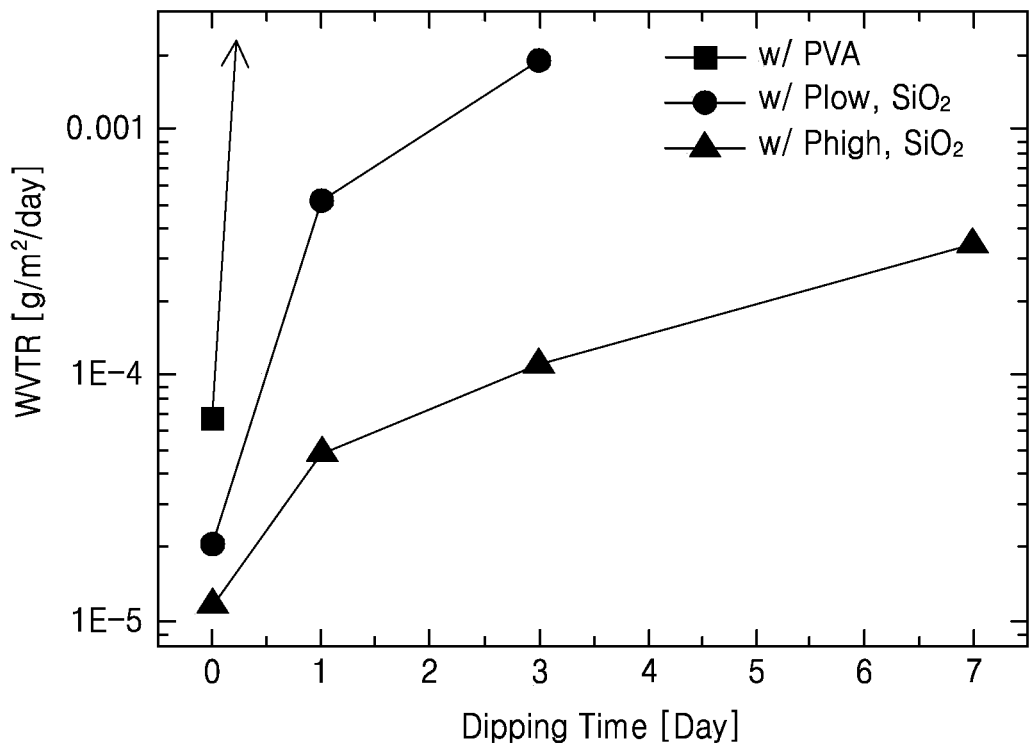
FIG. 6C is a graph showing the change in water vapor transmission rate (WVTR) with various dipping times, as an electrical calcium test result according to an experimental example of the present invention.

To examine the capping effect in a multi-dyad encapsulation barrier, the WVTR was measured over time for various kinds of encapsulation barrier, after immersion in detergent water. The same PVA, $P_{low,SiO2}$, and $P_{high,SiO2}$ were used as a polymer layer for an encapsulation barrier for comparison, respectively. The results are reported in FIG. 6C and Table 4, and show the same tendency as in the previous results. In the case of PVA, the encapsulation barrier suffered critical damage from detergent water, causing it to lose its WVTR in just a day.

Textile-Based Washable PSCs with the Functional Encapsulation Barrier

In this experimental example, a wearable PSC was fabricated with the functional encapsulation barrier on a real textile substrate made of polyethylene naphthalate (PEN) fibers. There are two kinds of method for applying an encapsulation barrier; direct encapsulation and attachable encapsulation. Direct encapsulation forms an encapsulation barrier directly on the fabricated device, while the procedure of attachable encapsulation attaches the transparent and flexible superstrate which contains the encapsulation barrier, to the fabricated device. Since the direct encapsulation is fabricated straight onto devices, it prevents the penetration of moisture and oxygen very efficiently, but the devices are exposed to thermal and ultraviolet (UV) damage during encapsulation. As the low bandgap polymer in this experiment is very vulnerable to thermal damage, the direct encapsulation method is not suitable. Recently, high-efficiency PSC devices using non-fullerene acceptors with narrow bandgap have been announced. Some of the devices with non-fullerene acceptors exhibit better thermal stability than conventional devices with the $PC_{71}BM$ fullerene acceptor, but it was reported that the power conversion efficiency (PCE) of these devices dropped drastically when exposed to sustained heat. Also, other devices with non-fullerene acceptors have shown high sensitivity to annealing temperatures. Therefore, even if a high-efficiency device is used, the device efficiency can be adversely affected by continuous exposure to the heat generated during the direct encapsulation process.

On the other hand, the infiltration of moisture and oxygen through the adhesive side is considered a disadvantage of attachable encapsulation. However, this issue is being solved by the development of new adhesive materials. In addition, the device is not only protected from heat and UV, but the entire process time is shortened because the deposition can be conducted on the substrate and superstrate simultaneously, and in parallel. This shorter process time can contribute to a reduction in manufacturing cost because it can be simultaneously applied to the roll-to-roll (R2R)

TABLE 4

| Polymer | Before dipping | After 1 day | After 3 days | After 7 days |
|---|---|---|---|---|
| PVA | $(6.65 \pm 0.89)^a \times 10^{-5}$ gm$^{-2}$day$^{-1}$ | N/A | N/A | N/A |
| $P_{low, SiO2}$ | $(2.04 \pm 0.47) \times 10^{-5}$ gm$^{-2}$day$^{-1}$ | $(5.09 \pm 0.66) \times 10^{-4}$ gm$^{-2}$day$^{-1}$ | $(1.09 \pm 0.32) \times 10^{-3}$ gm$^{-2}$day$^{-1}$ | N/A |
| $P_{high, SiO2}$ | $(1.18 \pm 0.44) \times 10^{-5}$ gm$^{-2}$day$^{-1}$ | $(4.85 \pm 0.49) \times 10^{-5}$ gm$^{-2}$day$^{-1}$ | $(1.10 \pm 0.41) \times 10^{-4}$ gm$^{-2}$day$^{-1}$ | $(3.44 \pm 0.45) \times 10^{-4}$ gm$^{-2}$day$^{-1}$ |

On the other hand, when $P_{low,SiO2}$ was used, it exhibited slight moisture permeability even after a certain time, due to the physical capping effect, which did not dissolve in water. Since the $P_{low,SiO2}$ has no chemical capping effect to prevent the phase transition, the WVTR sharply increased with time, and it became impossible to estimate after 7 days.

Figure 7A:
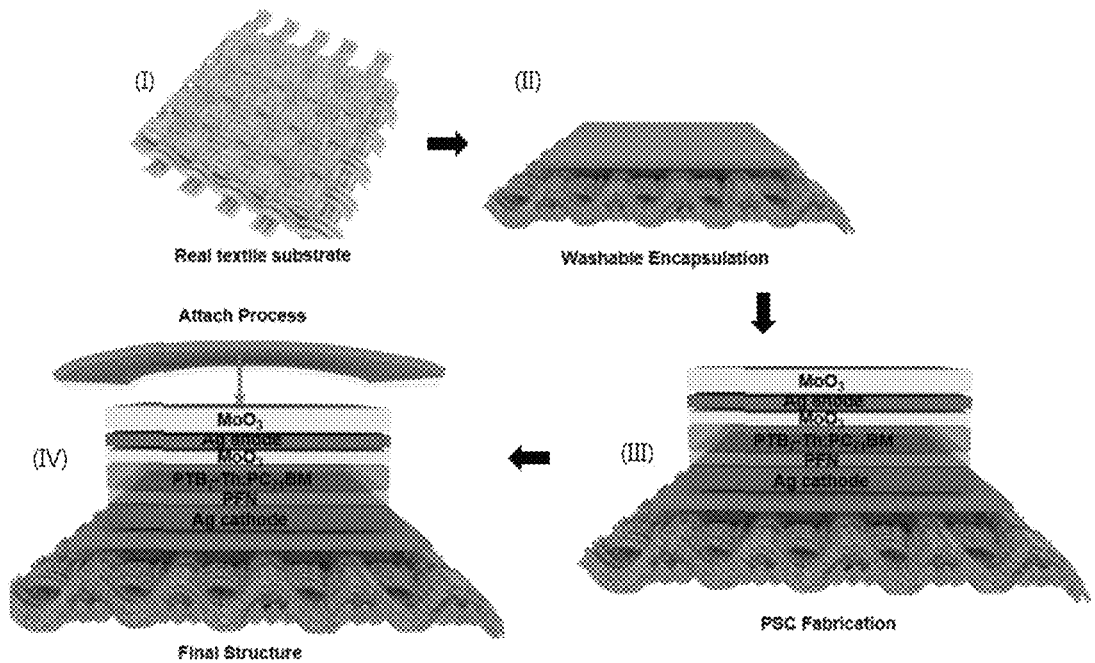
FIG. 7A is a schematic diagram of a fabrication process of textile-based washable PSCs with the functional encapsulation barrier, according to an experimental example of the present invention.

Nevertheless, for the encapsulation barrier of $P_{high,SiO2}$, $SiO_2$ polymer, it was found that the change in WVTR was not significant even after 7 days. Practically, in a real washing process and daily routine, the devices would not be dipped continuously in detergent over 7 days. As a result, it is expected that the proposed encapsulation barrier will play an important role in wearable devices.

process, and replace the existing slow ALD process. Also, the attachable encapsulation technology proposed in this experimental example does not require a special curing process to attach the encapsulation film to the wearable devices. This can minimize air exposure of the fabricated devices during the large area (4100 cm$^2$) encapsulation process by using the R2R method. This is possible because the encapsulation process can be completed immediately when attaching the pre-fabricated encapsulant film to the device using the R2R process, without any special curing process. This advantage enables potential application of the proposed attachable encapsulation technology to encapsulate large area flexible modules. FIG. 7A shows the fabrication process for the textile-based wearable PSC device.

TABLE 5

| Parameter | Before encapsulation | With direct encapsulation | With attachable encapsulation |
|---|---|---|---|
| $V_{OC}$ [V] | 0.77 (0.770 ± 0.022)[a] | 0.77 (0.762 ± 0.010) | 0.76 (0.769 ± 0.002) |
| $J_{SC}$ [mA cm$^{-2}$] | 14.44 (14.52 ± 0.15) | 9.53 (8.28 ± 0.62) | 14.43 (14.81 ± 0.16) |
| FF [%] | 64.48 (63.93 ± 1.40) | 49.74 (52.04 ± 6.68) | 64.40 (62.55 ± 1.14) |
| PCE [%] | 7.19 (7.15 ± 0.10) | 3.67 (3.26 ± 0.28) | 7.19 (7.12 ± 0.08) |

[a]These are statistical values of average and standard deviation obtained from 8 PSC samples.

Figure 7B:
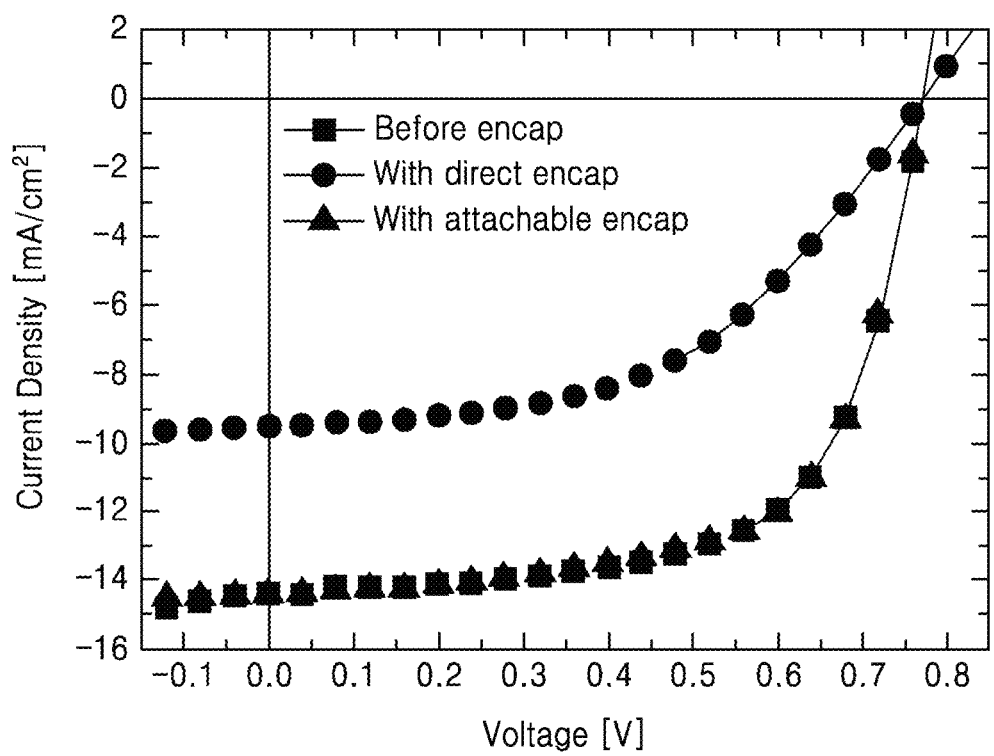
FIG. 7B is a graph showing J-V curves of textile-based washable PSCs with the functional encapsulation barrier before and after encapsulation, according to an experimental example of the present invention.

FIG. 7B and Table 5 show the difference between the direct and attachable encapsulation methods. The washing test was conducted several times to determine whether the textile-based PSC could operate stably without degradation. During the washing test, the devices were totally submerged in a solution of 2 vol % neutral detergent dissolved in DI water at 200 rpm for 10 minutes duration.

Figure 7C:
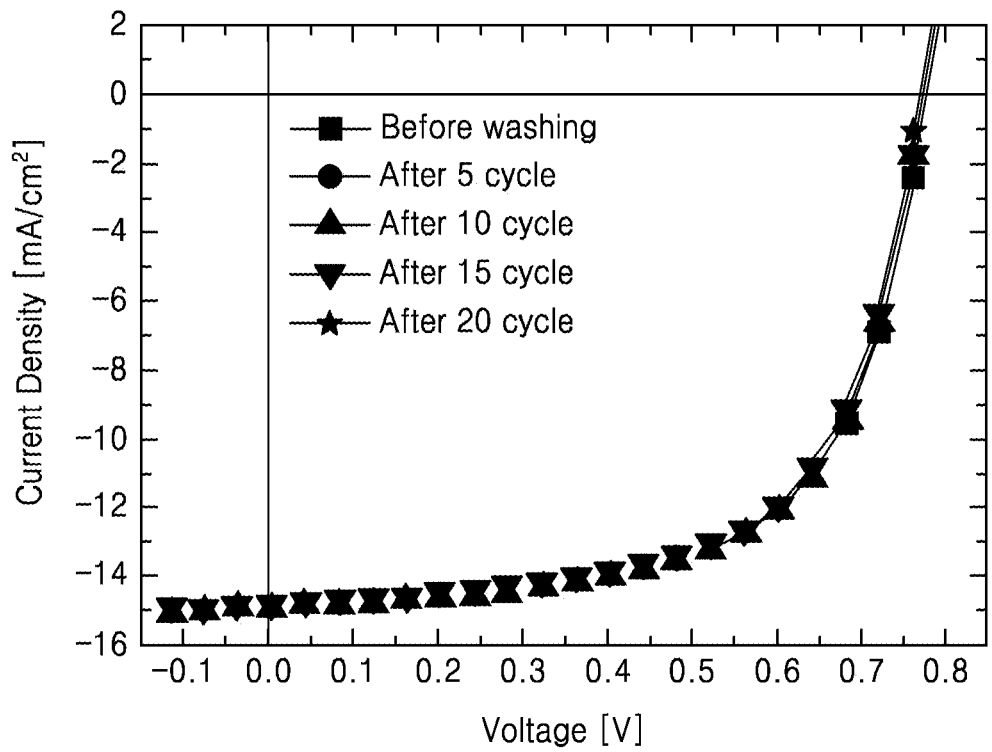
FIG. 7C is a graph showing J-V curves of textile-based washable PSCs with the functional encapsulation barrier before and after various washing cycles, according to an experimental example of the present invention.
Figure 7D:
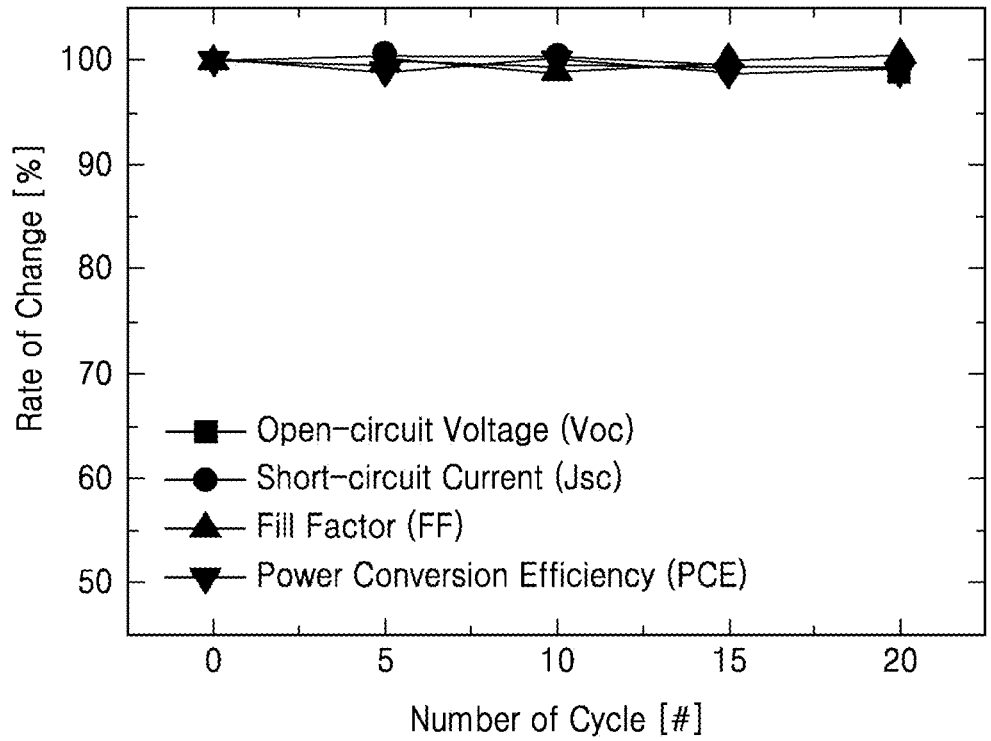
FIG. 7D is a graph showing the rate of change (ROC) of performance factors in textile-based washable PSCs with the functional encapsulation barrier, according to an experimental example of the present invention.

Because the surface roughness of the encapsulation barrier is less than 0.5 nm even after dipping, the device could be fabricated well on a textile substrate. FIG. 7C shows the change in the electrical characteristics of the textile-based wearable PSC with the number of washing cycles. For the device with the functional encapsulation barrier, the performance was maintained without deteriorating efficiency even after a total of 20 times washing. FIG. 7D indicates the change in the performance factors of the PSCs depending on the number of washings.

which enables textile-based OLEDs to act as a display with the energy generated from the textile-based PSC can be a core technology in wearable devices. For this reason, the PSCs and OLEDs were fabricated on a textile substrate together. In this experimental example, no physical damage, such as exfoliation of the superstrate, was found when tensile stress was applied to the device. In order to confirm the change in electrical characteristics due to bending, the bending test was repeated 1000 times at a bending radius of 3 mm. The electrical characteristics of each device after the bending test were measured and it was seen that the electrical characteristics were maintained, even after bending 1000 times. As described above, since the device uses the textile itself as a substrate, it has the advantage of being very flexible due to excellent mechanical properties of the textile. Therefore, it was confirmed that the textile-based device has enough flexibility to be used as a wearable device, even

TABLE 6

| Parameter | Before washing | After 5 cycles | After 10 cycles | After 15 cycles | After 20 cycles |
|---|---|---|---|---|---|
| $V_{OC}$ [V] | 0.77 (0.769 ± 0.002)[a] | 0.78 (0.768 ± 0.004) | 0.77 (0.769 ± 0.002) | 0.77 (0.768 ± 0.004) | 0.77 (0.768 ± 0.005) |
| $J_{SC}$ [mA cm$^{-2}$] | 14.85 (14.86 ± 0.16) | 14.92 (14.82 ± 0.15) | 14.91 (14.78 ± 0.14) | 14.77 (14.75 ± 0.13) | 14.75 (14.75 ± 0.14) |
| FF [%] | 62.99 (63.15 ± 0.18) | 62.89 (63.00 ± 0.34) | 62.35 (62.81 ± 0.51) | 62.94 (62.60 ± 0.74) | 63.34 (62.49 ± 0.90) |
| PCE [%] | 7.24 (7.22 ± 0.09) | 7.16 (7.17 ± 0.08) | 7.24 (7.14 ± 0.06) | 7.16 (7.10 ± 0.08) | 7.17 (7.07 ± 0.09) |

[a]These are statistical values of average and standard deviation obtained from 16 PSC samples.

From FIG. 7D and Table 6, it can be seen that the PSC with the functional encapsulation barrier retained more than 98% of its initial efficiency after the washing test. The other test factors also verified that the device could operate stably after washing. These results prove that the functional encapsulation barrier protected the moisture-sensitive wearable PSCs effectively during the washing process and also had no adverse effect on water penetration through the flank of the device.

Prototype of a Textile-Based Washable Optoelectronic Module

Figure 8A:
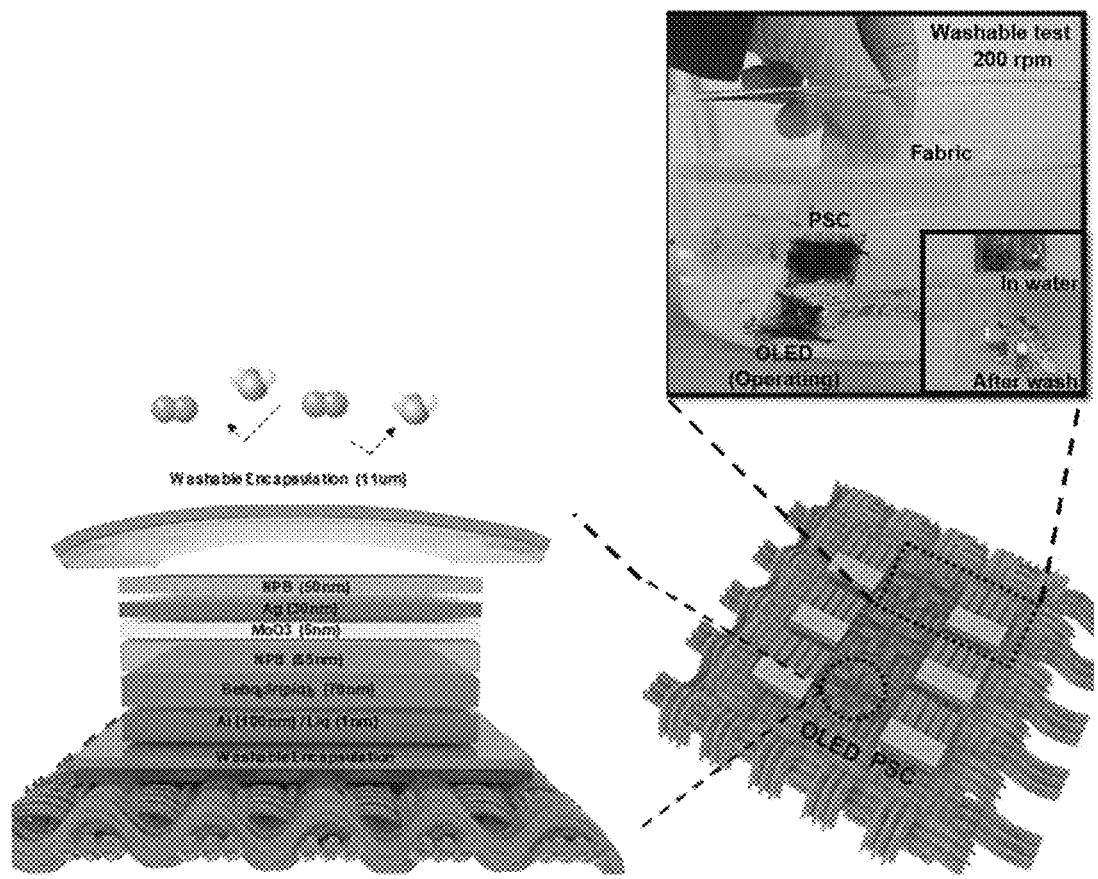
FIG. 8A shows an optoelectronic module and an organic light-emitting diode (OLED) structure and a picture of the operating module during the washable test with the inset image indicating the module being dipped in water after washing, in prototype of textile-based washable optoelectronic modules with the functional encapsulation barrier, according to an experimental example of the present invention.
Figure 8B:
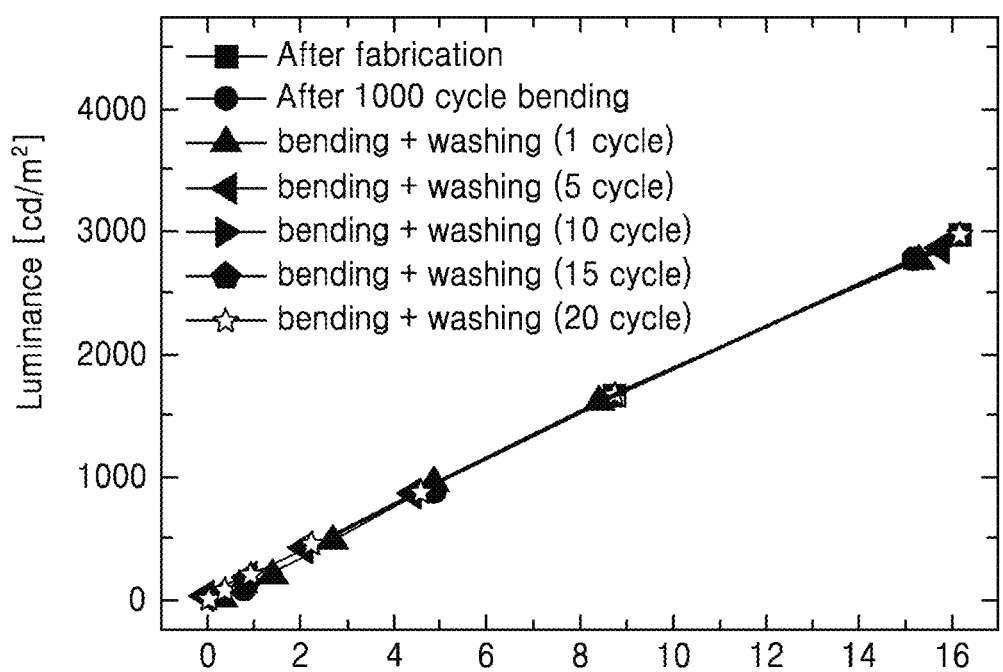
FIG. 8B is a graph showing electrical properties of the module with various conditions, and lifetime of the prototype optoelectronic module, in prototype of textile-based washable optoelectronic modules with the functional encapsulation barrier, according to an experimental example of the present invention.
Figure 8C:
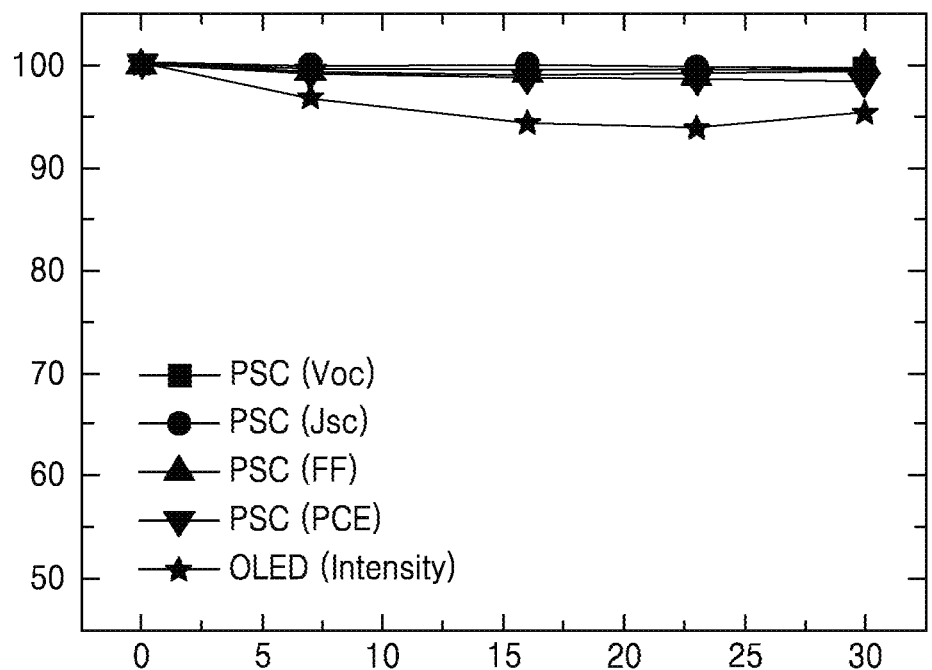
FIG. 8C is a graph showing the ROC of performance factors, in prototype of textile-based washable optoelectronic modules with the functional encapsulation barrier, according to an experimental example of the present invention.

Among the various electronic applications that can be driven with milliwatts, OLEDs are a light source that can be used to display information. The optoelectronic module when it contains a superstrate with an encapsulation barrier. The prototype of an optoelectronic module that contains both OLEDs and PSCs on a textile substrate was fabricated, and washing and bending tests were performed together to check the stability. The schematic and washing process of the fabricated prototype is shown in FIG. 8A. Despite the application of washing and bending, there was no change in the electrical characteristics of the device with the encapsulation barrier, as shown in FIG. 8B. Referring to FIG. 8C, if cracks are generated by tensile stress during bending, moisture penetrates rapidly during the washing process with significant deterioration, but no degradation was observed, as indicated in Table 7.

TABLE 7

| Measurement condition | Luminance [cd m$^{-2}$] | Current density [mA cm$^{-2}$] | Current efficiency [cd A$^{-1}$] |
|---|---|---|---|
| As-deposited | 1660.8 (1657.6 ± 4.6)[a] | 8.71 (8.77 ± 0.05) | 19.04 (19.01 ± 0.07) |
| After 1000 bending cycles | 1629.0 (1621.3 ± 6.6) | 8.57 (8.52 ± 0.04) | 18.99 (19.01 ± 0.01) |
| Bending + washing (1 cycles) | 1600.9 (1584.2 ± 17.2) | 8.42 (8.34 ± 0.08) | 19.01 (18.98 ± 0.04) |
| Bending + washing (5 cycles) | 1670.4 (1654.2 ± 30.5) | 8.65 (8.65 ± 0.19) | 18.97 (19.04 ± 0.11) |
| Bending + washing (10 cycles) | 1648.3 (1643.1 ± 4.3) | 8.66 (8.67 ± 0.02) | 19.02 (18.93 ± 0.09) |
| Bending + washing (15 cycles) | 1659.1 (1629.1 ± 30.4) | 8.72 (8.58 ± 0.15) | 19.01 (18.98 ± 0.02) |

TABLE 7-continued

| Measurement condition | Luminance [cd m$^{-2}$] | Current density [mA cm$^{-2}$] | Current efficiency [cd A$^{-1}$] |
|---|---|---|---|
| Bending + washing (20 cycles) | 1664.8 (1639.2 ± 24.5) | 8.76 (8.64 ± 0.11) | 18.99 (18.96 ± 0.06) |

$^a$These are statistical values of average and standard deviation obtained from 5 OLED samples.

Finally, the properties of the prototype modules ($N_{PSC}$=8, $N_{OLED}$=5) were measured every 7 days after 1000 iterations of bending and 10 minutes of washing. Table 8 shows the characteristics of each device, while FIG. 8C indicates the rate of change over time.

As a result, the prototype of the optoelectronic module showed high reliability, maintaining 98.3% of the initial PCE for the PSC, and 94.2% of the initial intensity for the OLED after 30 days. A washable textile-based optoelectronic module was realized in this experimental example using a functional encapsulation barrier, which maintained low WVTR after washing. To realize a wearable self-powered system, wearable secondary batteries that can store electrical energy are an essential element. Several studies of wearable batteries have been conducted. In order to charge the secondary battery effectively, the PSC module should generate the proper voltage and current. The proper voltage required for battery charging can be adjusted by making a series connection of the unit PSC devices, and the proper current required for battery charging can be adjusted by controlling the illuminated area of the unit PSC device, or by parallel connection of the unit PSC devices. The charging time of the battery depends on the capacity of the battery and the voltage/current amount generated by the PSC module. The discharging time depends on the capacity of the battery and the power consumed by the connected wearable devices. Therefore, the charging/discharging time of the battery of the self-powered system can be designed according to a specific use and environment. To implement an efficient self-powered system that consists of the PSC module and battery, the PSC module generates electric power for battery charging, and for devices operating during daytime when sunlight is available. After sunset, the battery should supply electric power to operate the other devices. For this reason, it can be extrapolated that the optimal charging time of the battery of the wearable self-powered system is 4 to 6 hours during the day time and the optimal discharging time is 3 to 5 hours at night.

Hydrophobicity (Water Contact Angle) Evaluation

Figure 9A:
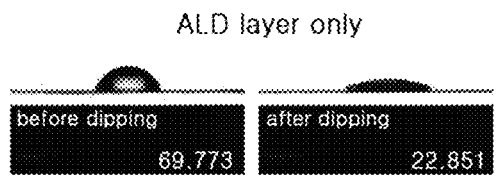
FIG. 9A shows the result of evaluating hydrophobicity of various layers based on water contact angles, according to an experimental example of the present invention.
Figure 9B:
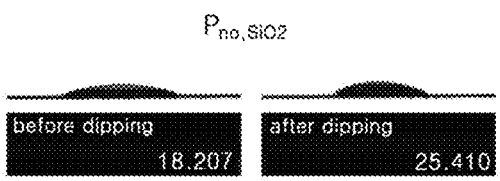
FIG. 9B shows the result of evaluating hydrophobicity of various layers based on water contact angles, according to an experimental example of the present invention.
Figure 9C:
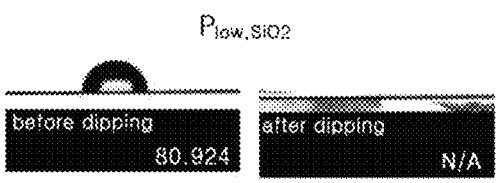
FIG. 9C shows the result of evaluating hydrophobicity of various layers based on water contact angles, according to an experimental example of the present invention.
Figure 9D:
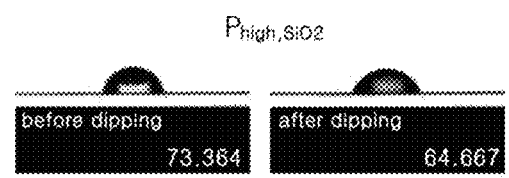
FIG. 9D shows the result of evaluating hydrophobicity of various layers based on water contact angles, according to an experimental example of the present invention.

FIGS. 9A to 9D show the result of evaluating hydrophobicity of various layers based on water contact angles, according to an experimental example of the present invention. FIG. 9A shows that the water contact angle on the surface of ALD-$Al_2O_3$ was about 69° before dipping and about 22° after dipping, FIG. 9B shows that the water contact angle on the surface of PVA ($P_{no,SiO2}$) was about 18° before dipping and about 25° after dipping, FIG. 9C shows that the water contact angle on the surface of cycloaliphatic epoxy oligosiloxane resin polymer ($P_{low,SiO2}$) was about 80° before dipping and was not available after dipping, and FIG. 9D shows that the water contact angle on the surface of $SiO_2$-polymer composite ($P_{high,SiO2}$) was about 73° before dipping and about 64° after dipping. That is, it is shown that only the $P_{high,SiO2}$ layer could be maintained in hydrophobicity after 7 days of being dipped in DI water.

CONCLUSIONS

In this experimental example, the present inventors fabricated highly reliable textile-based wearable PSCs including functional washable thin film encapsulation, and demonstrated their characteristics. The introduced functionalized $SiO_2$-polymer composite capping layer imparts stability, which prevents damage to the porous membrane during the washing process, through a chemical reaction with the internal $Al_2O_3$ layer. Since the chemical reaction prevents the phase transition of $Al_2O_3$, the encapsulation barrier can endure detergent water. The PSCs fabricated on a substrate of real textile showed excellent stability even after undergoing a washing process, without losing the mechanical flexibility of the textile. Even in the optoelectronic module, which was fabricated together with OLEDs, it showed high reliability with no deterioration in properties after 30 days under both bending stress and washing. The textile-based washable PSCs are expected to perform an important role in the next generation power sources of wearable E-textiles, and various optoelectronic applications, in the fourth industrial revolution.

According to an embodiment of the present invention, a washable nano-stratified encapsulation barrier and an electronic device including the same may be implemented. However, the scope of the present invention is not limited thereto.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A washable nano-stratified encapsulation barrier comprising:
   a stratified inorganic layer comprising an aluminum oxide layer; and
   a silica-polymer layer provided in direct contact with the aluminum oxide layer and having silicon (Si)-oxygen (O) bond.

2. The washable nano-stratified encapsulation barrier of claim 1, wherein the silica-polymer layer prevents phase transition of the aluminum oxide layer.

3. The washable nano-stratified encapsulation barrier of claim 1, wherein the aluminum oxide layer has an amorphous structure, and
   wherein the silica-polymer layer prevents phase transition of the aluminum oxide layer from the amorphous structure to a crystalline structure.

4. The washable nano-stratified encapsulation barrier of claim 1, wherein the silica-polymer layer comprises a cycloaliphatic epoxy oligosiloxane resin having Si—O bond.

5. The washable nano-stratified encapsulation barrier of claim 1, wherein the silica-polymer layer comprises a $SiO_2$-polymer composite having Si—O bond.

6. The washable nano-stratified encapsulation barrier of claim 1, wherein the stratified inorganic layer further comprises a material layer comprising at least one material selected from the group consisting of zinc oxide, zirconium oxide, titanium oxide, magnesium oxide, tungsten oxide, zinc sulfide, yttrium oxide, hafnium oxide, silicon oxide, silicon nitride, silicon oxynitride, aluminum nitride, magnesium fluoride, titanium nitride, hafnium nitride, and zirconium nitride.

7. An electronic device comprising:
a substrate;
the washable nano-stratified encapsulation barrier selected according to claim 1 and provided on the substrate; and
an organic electronic device provided on the substrate.

8. The electronic device of claim 7, wherein the substrate comprises at least one of fiber, textile, plastic, and a release liner.

9. The electronic device of claim 7, wherein the organic electronic device comprises a polymer solar cell (PSC) device, an organic light-emitting diode (OLED) device, a quantum dot (QD) device, or a perovskite device.

\* \* \* \* \*